(12) United States Patent
Adam et al.

(10) Patent No.: US 12,069,795 B2
(45) Date of Patent: Aug. 20, 2024

(54) METHODS FOR AND APPARATUSES OF A CIRCUIT BOARD COOLING DEVICE

(71) Applicant: Aptiv Technologies AG, Schaffhausen (CH)

(72) Inventors: Frank H. Adam, Dublin (IE); Falk Rademacher, Dublin (IE)

(73) Assignee: Aptiv Technologies AG, Schaffhausen (CH)

( * ) Notice: Subject to any disclaimer, the term of this patent is extended or adjusted under 35 U.S.C. 154(b) by 0 days.

(21) Appl. No.: 17/932,564

(22) Filed: Sep. 15, 2022

(65) Prior Publication Data

US 2023/0090833 A1 Mar. 23, 2023

(30) Foreign Application Priority Data

Sep. 17, 2021 (GB) ...................................... 2113332

(51) Int. Cl.
*H05K 1/02* (2006.01)
(52) U.S. Cl.
CPC .................................. *H05K 1/0204* (2013.01)
(58) Field of Classification Search
CPC ......... H05K 1/0201–0204; H05K 1/09; H05K 1/18–181; H05K 7/20154; H05K 7/20254; H05K 7/2039; H05K 7/20409–20418; H05K 7/2049; H05K 7/02–436; H05K 7/20509; H05K 2201/066; H05K 2201/0715; H05K 2201/10265;

(Continued)

(56) References Cited

U.S. PATENT DOCUMENTS

| | | |
|---|---|---|
| 4,879,629 A | 11/1989 | Tustaniwskyj et al. |
| 4,920,574 A | 4/1990 | Yamamoto et al. |
| 5,001,548 A | 3/1991 | Iversen |

(Continued)

FOREIGN PATENT DOCUMENTS

| | | |
|---|---|---|
| DE | 2614917 | 10/1976 |
| EP | 2361005 | 8/2011 |

(Continued)

OTHER PUBLICATIONS

WO-2021215187-A1 English Translation (Year: 2021).*

(Continued)

*Primary Examiner* — Amir A Jalali
(74) *Attorney, Agent, or Firm* — Harness, Dickey & Pierce, P.L.C.

(57) ABSTRACT

Disclosed are aspects of apparatuses and methods of fitting a cooling device to a circuit board for cooling a high-power electronic component mounted on the circuit board. Cooling apparatuses, and arrangement thereof, are also described. The method provides the cooling device with a cooling surface having a cooling area for thermally connecting to a to-be-cooled surface of the electronic component. Fixing elements are provided for moving the cooling surface towards the circuit board. A distance position "d" of the to-be-cooled surface from the circuit board is determined, and on this basis spacer elements are selected to be interposed between the cooling device and the circuit board to limit the movement by the fixing elements to a position where the cooling area is in proximity to the to-be-cooled surface.

12 Claims, 1 Drawing Sheet

(58) Field of Classification Search
CPC .......... H05K 2201/10409; H05K 2201/10522; H01L 23/3675; H01L 23/3736; G06F 1/20

See application file for complete search history.

(56) References Cited

U.S. PATENT DOCUMENTS

| | | | |
|---|---|---|---|
| 5,548,482 A | 8/1996 | Hatauchi et al. | |
| 5,608,610 A | 3/1997 | Brzezinski | |
| 5,926,371 A * | 7/1999 | Dolbear | H05K 1/0204 257/713 |
| 6,035,524 A | 3/2000 | Suppa et al. | |
| 6,043,981 A | 3/2000 | Markow et al. | |
| 6,111,749 A | 8/2000 | Lamb et al. | |
| 6,212,074 B1 * | 4/2001 | Gonsalves | H01L 23/4275 174/16.3 |
| 6,215,667 B1 * | 4/2001 | Ady | H05K 7/142 361/767 |
| 6,364,009 B1 | 4/2002 | Macmanus et al. | |
| 6,665,184 B2 | 12/2003 | Akselband et al. | |
| 6,850,411 B1 | 2/2005 | Patel | |
| 6,853,554 B2 | 2/2005 | Bash et al. | |
| 6,972,958 B2 | 12/2005 | Mayer | |
| 6,979,899 B2 * | 12/2005 | Edwards | H01L 23/36 257/E23.101 |
| 7,212,409 B1 | 5/2007 | Belady et al. | |
| 7,283,364 B2 | 10/2007 | Refai-Ahmed et al. | |
| 7,298,617 B2 | 11/2007 | Campbell et al. | |
| 7,385,821 B1 | 6/2008 | Feierbach | |
| 7,995,344 B2 * | 8/2011 | Dando, III | H01L 23/433 257/713 |
| 8,373,990 B2 | 2/2013 | Jarmany | |
| 8,432,691 B2 | 4/2013 | Toftloekke et al. | |
| 8,966,747 B2 | 3/2015 | Vinciarelli et al. | |
| 9,036,353 B2 | 5/2015 | Buckman et al. | |
| 9,331,058 B2 | 5/2016 | Bruno et al. | |
| 9,694,451 B1 | 7/2017 | Ross | |
| 10,342,119 B1 | 7/2019 | Mujcinovic | |
| 10,448,545 B2 | 10/2019 | Lim et al. | |
| 10,631,438 B2 | 4/2020 | Coteus et al. | |
| 11,076,503 B2 | 7/2021 | Korta et al. | |
| 2003/0015314 A1 | 1/2003 | Akselband | |
| 2005/0241799 A1 | 11/2005 | Malone et al. | |
| 2006/0215383 A1 * | 9/2006 | Unrein | H01L 23/4006 361/810 |
| 2007/0177356 A1 * | 8/2007 | Panek | H01L 23/433 257/E23.125 |
| 2008/0266808 A1 * | 10/2008 | Aberg | H01L 23/4338 361/709 |
| 2008/0296256 A1 * | 12/2008 | Panek | H05K 7/20463 257/E23.125 |
| 2009/0021918 A1 * | 1/2009 | Fang | H01L 23/4006 361/720 |
| 2009/0213541 A1 | 8/2009 | Butterbaugh et al. | |
| 2010/0181665 A1 * | 7/2010 | Casey | H01L 23/433 257/723 |
| 2010/0195297 A1 * | 8/2010 | Matsuzaki | H05K 3/284 361/758 |
| 2011/0149537 A1 | 6/2011 | Kurosawa | |
| 2011/0310560 A1 | 12/2011 | Jarmany | |
| 2012/0063098 A1 | 3/2012 | Paquette et al. | |
| 2014/0146475 A1 | 5/2014 | Buckman et al. | |
| 2014/0233175 A1 | 8/2014 | Demange et al. | |
| 2015/0131224 A1 | 5/2015 | Barina et al. | |
| 2015/0173169 A1 * | 6/2015 | Zhang | H01L 23/3675 361/720 |
| 2016/0233141 A1 * | 8/2016 | Hirobe | H01L 23/04 |
| 2016/0290728 A1 | 10/2016 | Coteus et al. | |
| 2016/0291652 A1 | 10/2016 | Rossi et al. | |
| 2017/0082222 A1 | 3/2017 | Buvid et al. | |
| 2018/0006391 A1 * | 1/2018 | Alcorn | H01R 12/778 |
| 2018/0348827 A1 * | 12/2018 | Matheson | H05K 1/0209 |
| 2019/0200485 A1 | 6/2019 | Coteus et al. | |
| 2019/0204023 A1 | 7/2019 | Takken et al. | |
| 2019/0259632 A1 | 8/2019 | Isaacs et al. | |
| 2020/0024763 A1 | 1/2020 | Dan et al. | |
| 2020/0232688 A1 | 7/2020 | Ganter et al. | |
| 2020/0337181 A1 | 10/2020 | Tian et al. | |
| 2022/0217868 A1 | 7/2022 | Adam et al. | |
| 2022/0377929 A1 * | 11/2022 | Hidaka | H05K 7/20409 |

FOREIGN PATENT DOCUMENTS

| | | |
|---|---|---|
| EP | 2884530 | 6/2015 |
| EP | 3923689 | 12/2021 |
| EP | 3955716 | 2/2022 |
| GB | 2310321 | 8/1997 |
| GB | 2584991 | 12/2020 |
| WO | 2010077237 | 7/2010 |
| WO | 2020035172 | 2/2020 |
| WO | 2020234600 | 11/2020 |
| WO | WO-2021215187 A1 * | 10/2021 |

OTHER PUBLICATIONS

"Notice of Allowance", U.S. Appl. No. 17/231,794, filed Jun. 13, 2023, 7 pages.
"Extended European Search Report", EP Application No. 21205717.8, Apr. 4, 2022, 33 pages.
"Final Office Action", U.S. Appl. No. 17/231,794, filed Dec. 8, 2022, 8 pages.
"Non-Final Office Action", U.S. Appl. No. 17/932,564, filed Oct. 12, 2022, 9 pages.
"Advisory Action", U.S. Appl. No. 17/231,794, filed Jan. 13, 2023, 3 pages.
"Non-Final Office Action", U.S. Appl. No. 17/231,794, filed Mar. 21, 2023, 10 pages.
"Extended European Search Report", EP Application No. 21150125.9, May 31, 2021, 16 pages.
"Extended European Search Report", EP Application No. 20179751.1, Nov. 18, 2020, 12 pages.
"Search Report", GB Application No. 2113332.7, Jun. 29, 2022, 4 pages.

* cited by examiner

METHODS FOR AND APPARATUSES OF A CIRCUIT BOARD COOLING DEVICE

INCORPORATION BY REFERENCE

This application claims priority to United Kingdom Patent Application Number GB2113332.7, filed Sep. 17, 2021, the disclosure of which is incorporated by reference in its entirety.

BACKGROUND

Some electronic components get hot during use because they require relatively high-power to operate. One example of such a high-power electronic component is a System-on-a-Chip (SoC). This generates large amounts of waste heat when operating. Overheating of such high-power components is a problem because this can compromise their function or lead to component damage. Consequently, a cooling device is provided to accommodate their heat transfer demands to avoid or reduce the problem.

Typically, a number of electronic components are mechanically supported by and electrically interconnected by electrically conductive pathways formed on a circuit board. The circuit board takes the form of a planar non-conductive substrate with the electrically conductive pathways formed thereon in known manners. These are known as printed circuit boards (PCB).

The position of the electronic components on the circuit board is highly specified according to the circuit design and the conductive pathways formed on the non-conductive substrate. In addition, the types of electronic components vary, as will be explained hereinafter, according to the desired circuit to be formed on the PCB.

In many cases of PCBs, a number of high-power components are located at different positions spread across the circuit board. The surface of the component most remote from the circuit board is located at a distance position spaced from the plane of the circuit board, that is to say the surface is a certain height relative to the plane of the circuit board. The surface is usually the to-be-cooled surface which is thermally connected to a cooled device to enable heat transfer away from the component. Typically, the height distances of the individual high-power components are different to each other.

Furthermore, the PCB circuit will typically include low-power components generating relatively less waste heat. These low-power components will also have height distances different to each other, and the height distances are generally larger than the height distances of the high-power electronic components. Whilst these low-power components will have lower heat transfer demands and lower cooling needs than the high-power electronic components, they still include a to-be-cooled surface for transferring heat to a cooling device.

In addition to the above electronic components, the PCB circuit will also typically include other adjacent components which are passive such as diodes and capacitors which have no cooling needs and do not require active cooling at all. Passive components typically have even larger height distances than the adjacent high-power and low-power components.

It is therefore apparent that the profile of height distances of all the components across the PCB is variable with respect to a plane defined by the circuit board.

As noted above, it is important to avoid overheating of the high-power electronic components on the PCB. Hence, it is critical to efficiently cool high-power components so that their cooling needs are met. As such, it is common to fit cooling devices to maintain the operating temperature of the high-power components within an acceptable tolerance.

In one case, the cooling device can be a heat sink having a cooling surface for thermally conducting the heat away from a to-be-cooled surface of the electronic component and into the heat sink. For those components which are particularly high-power with high heat transfer needs, liquid cooling devices are often used due to their high cooling efficiency. Conventional liquid cooling devices, usually called "cold plate," typically comprise a flat metal body with an internal circuit of cooling channels or tubes through which coolant fluid may be circulated. The present disclosure relates to at least both such cooling devices.

The cooling device typically has a cooling surface which is formed to have a profile to match the height distance profile of the component or each component on the PCB which it is to cool when the cooling device is fitted to the circuit board. Thus, after fitting, the cooling surface should be located close to the to-be-cooled surface of the high-power electronic components to provide a heat transfer pathway between the two. Then, as the electronic components get hot, heat is transferred through this heat transfer pathway from the to-be-cooled surface to the cooling surface and into the cooling device which will dissipate that heat.

Although attempts are made to have cooling areas of the cooling surface of the cooling device which correspond with the profile of the components on the circuit board which require cooling, a mismatch between the two surfaces typically occurs which results in an air gap between the cooling area and the to-be-cooled surfaces of the component or each component that requires cooling.

Such air gaps result in a heat transfer pathway with a thermal conduction which is significantly less than a direct thermal conduction. Consequently, there is a lower heat flow from the component to the cooling device. This can result in unacceptable increases in the temperature of the component.

To counter this, it is known to apply a layer of Thermal Interface Material (TIM), such as thermal grease, to fill these gaps in an attempt to provide a better thermal conduction for the heat transfer pathway between the components and the cooling device. However, as larger gaps can still occur, a relatively thick layer of TIM must be applied for those gaps to ensure there is sufficient material to fill them in their entirety.

Although the thermal conductivity of TIM is much higher compared to air, it is a lot lower than that of the heat conducting materials used for the cooling surface of the cooling device and the to-be-cooled surface of the component. It therefore still represents a significant thermal resistance which will vary depending on the thickness of the TIM layer. Consequently, it is desirable to minimise the thickness of the TIM layer.

As noted above, there is usually a mismatch when attempts are made to have cooling areas of the cooling surface correspond with the to-be-cooled surfaces of the components on the circuit board which require cooling.

Although the height distances of the individual components to be mounted on the circuit board are specified prior to the production of the PCB, this does not completely prevent the mismatch because of tolerances in the production process of the PCBs.

When a PCB is produced, various of the above individual components are attached to the circuit board. However, due to the mounting process of attaching the components, the actual height distance of the individual component from the plane of the circuit board will not usually correspond accurately with the specification of the height distances of the individual component.

Furthermore, it is quite possible for the circuit board to be bent during or after production. Assuming a plane defined by an unbent circuit board, the result is that the height distance of the individual components can vary from that plane. Accordingly, there are significant tolerances in the dimensional accuracy of the eventual PCB.

As a result, it has not been possible to significantly reduce the above air gaps, and it has not been possible to sufficiently improve the heat flow pathways between high-power electronic components and low-power components and cooling devices.

Therefore, there remains a need for an improved method of fitting a cooling device to a circuit board which can improve the cooling of at least the high-power electronic components on the circuit board and which can reduce the TIM layer thickness between the cooling surface of the cooling device and to-be-cooled surface of these components.

SUMMARY

The present disclosure concerns a method of fitting a cooling device to a circuit board for cooling at least one high-power electronic component mounted on the circuit board and a cooling arrangement to cool the high-power electronic component mounted on a circuit board.

The present disclosure is relevant, for example, to cooling electronic control units for automotive applications.

According to a first aspect, there is provided a method of fitting a cooling device to a circuit board for cooling a high-power electronic component mounted on the circuit board, the method comprising: providing a cooling device with a cooling surface having a cooling area for thermally connecting to a to-be-cooled surface of the electronic component; providing fixing elements for moving the cooling surface towards the circuit board; determining a distance position of the to-be-cooled surface from the circuit board; and selecting, on the basis of the determined distance position, spacer elements to be interposed between the cooling device and the circuit board to limit the movement by the fixing elements to a position where the cooling area is in proximity to the to-be-cooled surface.

By using spacer elements, the cooling device can be moved to bring the cooling surface towards the to-be-cooled surface with dimensional accuracy such the two surfaces can be close together to reduce, if not minimise, any gap between them such that use of TIM can either be eliminated or substantially minimised. As a result, the heat transfer pathway between the two surfaces can more closely correspond to a direct contact thermal conduction.

This dimensional accuracy is not affected by the tolerances involved in the production of the PCB. In particular, it compensates for positional deviations of the component heights from specified values caused by production tolerances enabling reduction, and even minimization, of the TIM layer thickness ensuring optimal, or at least enhanced, component cooling. Since the closest possible contact can be provided between the two surfaces, any TIM layer is only required to compensate for surface roughness and is as thin as possible.

In particular, better and optimal heat transfer away from high-power electronic components is facilitated. Furthermore, the use of spacer elements reduces the TIM thickness used in connection with the high-power electronic components further improving heat transfer. Finally, because the cooling device is now fitted to the circuit board and not necessarily any housing for the PCB, alternative designs for a housing can be produced which can use simpler and cheaper materials, such as sheet metal or plastic covers. The use of spacer elements reduces material storage and reduces material usage compared with conventional housing/cooling device combinations.

In one embodiment, the spacer elements are selected to limit the movement by the fixing elements to a position where the cooling area is substantially in contact with the to-be-cooled surface with a minimal air gap.

In another embodiment, for cooling one or more additional electronic components mounted on the circuit board, the cooling surface has a respective additional cooling area corresponding to a respective to-be-cooled surface of the one or more additional electronic components; wherein the additional cooling area or each additional cooling area is spaced from the circuit board by a distance which is greater than said determined distance position.

It is convenient if the fixing elements provide a biasing force for moving the cooling surface towards the circuit board.

In another embodiment, the fixing elements extend between the cooling device and the circuit board for moving the cooling surface towards the circuit board.

In another embodiment, couplings are provided for the fixing elements to enable the cooling device to be fitted to the circuit board.

It is convenient if the couplings comprise a part of a housing.

According to a second aspect, there is provided a cooling arrangement to cool a high-power electronic component mounted on a circuit board, the cooling arrangement comprising: a cooling device with a cooling surface having a cooling area for thermally connecting to a to-be-cooled surface of the electronic component, wherein the to-be-cooled surface is a determined distance position from the circuit board; fixing elements for moving the cooling device towards the circuit board; and spacer elements, selectable on the basis of the determined distance position, for interposing between the cooling device and the circuit board to limit the movement by the fixing elements to a position where the cooling area is in proximity to the to-be-cooled surface.

In one embodiment, the spacer elements are selected to limit the movement by the fixing elements to a position where the cooling area is substantially in contact with the to-be-cooled surface with a minimal air gap.

In another embodiment, to cool one or more additional electronic components mounted on the circuit board, wherein the cooling surface has a respective additional cooling area corresponding to a respective to-be-cooled surface of the one or more additional electronic components, the additional cooling area or each additional cooling area is spaced from the circuit board by a distance which is greater than said determined distance position.

In one embodiment, the fixing elements include means to provide a biasing force for moving the cooling surface towards the circuit board In still another embodiment, the fixing elements are sized to extend in use between the cooling device and the circuit board for moving the cooling surface towards the circuit board.

In one embodiment, further couplings are provided for the fixing elements to enable the cooling device to be fitted to the circuit board.

Conveniently, a plurality of spacer elements is provided for selection.

BRIEF DESCRIPTION OF THE DRAWINGS

Illustrative embodiments will now be described with reference to the accompanying drawings in which.

DETAILED DESCRIPTION

In the present description, the term printed circuit board includes a plurality of electronic components which are mounted on a circuit board which includes electrically conducting material to define the electrical connections between the mounted electronic components.

Figure 1:
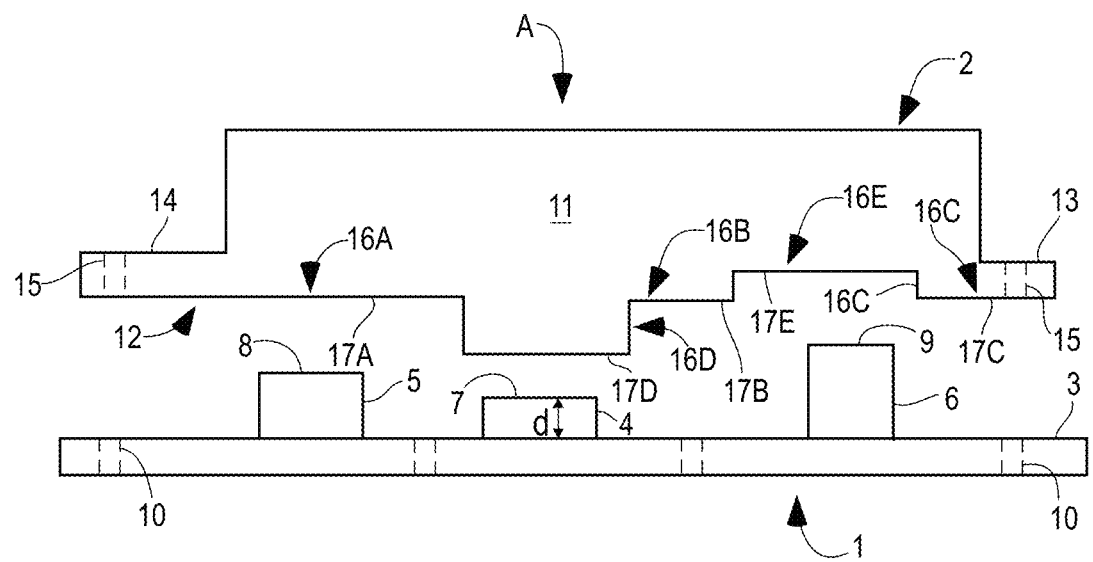
FIG. 1 shows a side view of a cooling device and a printed circuit board according to a first embodiment prior to fitting of the cooling device.

FIG. 1 shows a side view of a printed circuit board 1 and a cooling device 2. The printed circuit board has a circuit board 3 with a high-power electronic component 4 mounted thereon. The high-power electronic component can be an SOC or other high-performance component needing optimum cooling to avoid damage. Further, low-power electronic components 5 and 6 are also mounted on the circuit board 3 in the locality of the high-power component 4.

The electrical connections between the mounted components are not illustrated. It will be appreciated that there can be a plurality of components spread mounted across the circuit board including passive components (not shown for clarity).

As can be seen, the high-power electronic component 4 has a generally planar upper to-be-cooled surface 7 remote from and parallel to the plane of the circuit board 3. This to-be-cooled surface 7 is to be cooled so that excess heat can be removed from the high-power electronic component 4. This surface to-be-cooled is spaced a distance "d" from the plane of the surface of the circuit board 3. In this description, the distance between a plane spaced from the plane of the circuit board 3 is referred to as the height distance above the circuit board, and the to-be-cooled surface 7 is referred to as the upper or top surface of the component 4.

As can be seen, the low-power electronic components 5 and 6 have respective generally planar to-be-cooled upper surfaces 8 and 9 remote from and parallel to the circuit board 3. These surfaces also are to be cooled so that excess heat can be removed from the respective component. However, the cooling requirement of the components 5 and 6 is less than that of the component 4. It will also be noted that the height distance of the upper surfaces 8 and 9 is greater than that of the upper surface 7. Of course, the upper surfaces 8 and 9 could be lower than the upper surface 7.

On the printed circuit board 1, holes 10 are provided to extend through the edges of the circuit board perpendicular to the plane of the circuit board 3. Of course, the holes 10 can be provided at any suitable location on the PCB.

The cooling device 2 in this embodiment is a heat sink and comprises a main solid body 11 (or cold plate for liquid cooling) having a profiled lower cooling surface 12 facing the circuit board 3. Thinned edges 13 and 14 are provided at the edges. Holes 15 are provided to extend through the thinned edges 13 and 14 of the circuit board perpendicular to the plane of the circuit board 3 and aligned with the holes 10.

It will be appreciated that the solid body can be replaced by a body with fins or other ways of dissipating heat from the cooling device.

The cooling surface 12 has a lower surface facing the circuit board which has three portions 16A, 16B, and 16C, as shown in the figure, which are aligned on a single plane parallel to the plane of the circuit board 3. The first portion 16A extends from the left edge in the figure towards the centre of the surface 12 and defines a cooling surface 17A. This surface includes a cooling area for the to-be-cooled surface 8. The second portion 16C extends from the right edge towards the centre of the surface 12 and defines a cooling surface 17C.

To the right of the portion 16A as shown, the cooling surface 12 has a further portion 16D which extends further towards the circuit board and defines a cooling surface 17D. Thus, the cooling surface 17D is closer to the circuit board than the cooling surface 17A. This surface includes a cooling area for cooling the to-be-cooled surface 7.

To the left of the portion 16C as shown, the cooling surface has a further portion 16E which extends further away from the circuit board and defines a cooling surface 17E. Thus, the cooling surface 17E is further from the circuit board than the cooling surface 17A. This surface includes a cooling area for cooling the to-be-cooled surface 9.

The portion 16B is interposed between the portions and has a lower cooling surface 17B.

As can be seen, the lower cooling surface 12 has a profile so that the cooling surface 17D is opposed to and facing the electronic component 4, the cooling surface 17A is opposed to and facing the electronic component 5, and the cooling surface 17E is opposed to and facing the electronic component 6.

A method will now be described for fitting the cooling device 2 to the circuit board 3 whereby the surface 17D can be brought into very close contact with the surface 7 and with a minimal air gap.

Figure 2:
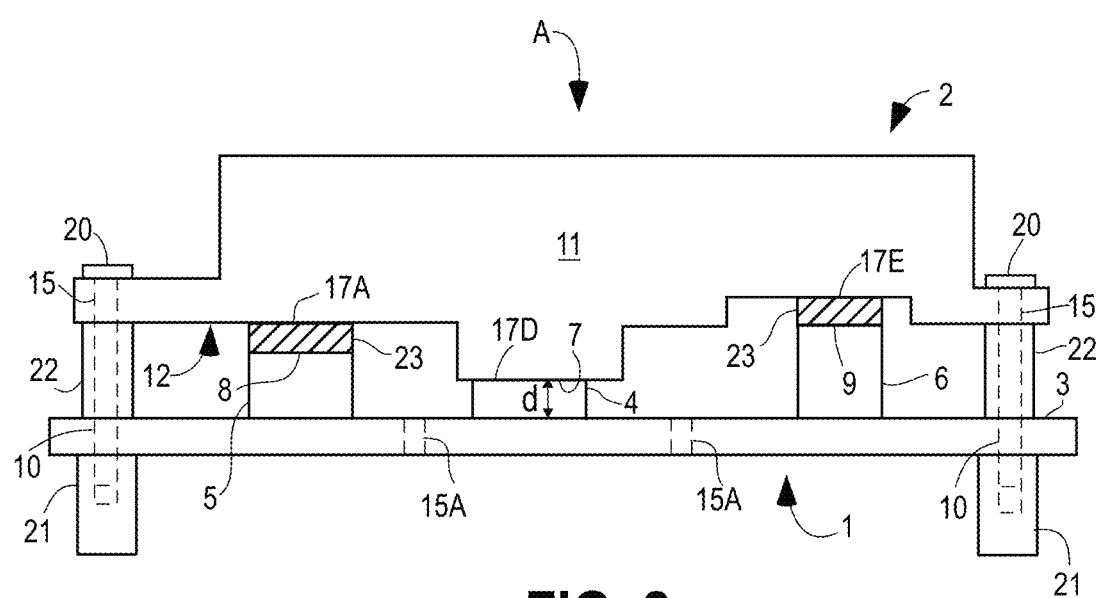
FIG. 2 shows a side view of the cooling device and the printed circuit board of FIG. 1 after fitting of the cooling device.

Reference is made to FIG. 2. After production of the printed circuit board 1 corresponding to the components 4, 5, and 6 mounted on the circuit board 3, the profile of the components and circuit board can be accurately determined by a suitable measuring device. In one example, an optical 3D-scanner can be used. This can determine the distance position "d" of the to-be-cooled surface 7 from the circuit board. The determined distance will take into account production variations and tolerances for the PCB and any bending of the circuit board during production. This can be done for each individual high-power electronic component.

Fixing elements are then provided for attaching and moving the cooling device 2 towards the circuit board 3. In FIG. 2, the fixing elements comprise respective screws 20. These are positioned to extend through the respective holes 15 of the cooling device 2 and to extend through the holes 10 in the circuit board 3, and the screws 20 are located and screwed into couplings in the form of internally threaded sleeves 21 provided on the opposite lower side of the circuit board 3.

Thus, as the screws 20 are screwed into the sleeves 21, the cooling surface 12 of the cooling device 2 is moved towards the circuit board 3. The movement of the cooling device 2 towards the circuit board 3, in the direction of arrow A, aims to get the cooling surface 17D to a position which is as close as possible to the to-be-cooled surface 7 of the high-power electronic component 4—without damage to the component by too much movement and without much of an air gap by too little movement.

In order to do this, before the screws 20 are passed through the holes 10, a spacer element 22 is interposed between the cooling device 2 and the circuit board 3 to limit the movement of the cooling device towards the circuit board by screwing in the screws. In this respect, the size of the spacer element 22 is selected according to the determined distance position "d" of the to-be-cooled surface 7 from the circuit board 3.

As shown in FIG. 2, the spacer element can take the form of a tube 22 which can be slid over the screws 20 before they are screwed and tightened into the sleeves 21. As the screws 20 are screwed into the couplings, the movement is limited by the spacer element 22 to a position where the cooling surface 17D and the cooling area thereof is in close proximity to the to-be-cooled surface 7, and additionally without the risk of damage to the high-power electronic component 4 due to over tightening of the screws 20. In this way, the use of TIM in any air gap between the two surfaces can be minimized, or at least reduced, so that the thermal pathway functions in an optimal, or at least enhanced, way.

As already noted, the additional cooling surfaces 17A and 17E corresponding to the to-be-cooled surfaces 8 and 9 of the additional electronic components 5 and 6 are spaced from the circuit board by a distance which is greater than the determined distance position "d." The air gap between the cooling areas of the cooling surfaces 17A and 17E and the to-be-cooled surfaces 8 and 9 can be filled with TIM 23 in the known way.

It will be appreciated that the area of the cooling surface 12 of the cooling device 2 in plan view as viewed along the arrow A can be varied to encompass either a single high-power electronic component alone, or optionally with additional electronic components to be cooled. The cooling device concentrates on the cooling of the one high-power electronic component, preferably located centrally below the cooling device positioned high-power electronic component. This provides the optimum cooling.

As the area of the cooling surface 12 increases, there is a requirement for extra fixing elements. For example, four screws 20 and associated sleeves 21 and couplings can be used.

Furthermore, a support frame (not shown) for the high-power component can be located on the opposite side of the circuit board 3 to the high-power electronic component 4 to provide support therefor. This support frame can include holes for additional screws 20 (not shown) which pass through holes 15A in the circuit board to couple with threaded holes in the cooling surface 12 (not shown). Further spacer elements 22 can be located over these additional screws.

In order to allow for the different production tolerances and component heights, a set of precisely manufactured and dimensioned spacer elements 22 featuring several different heights can be produced and made available. These can be either individually used or combined together to obtain the required limit spacing. For example, they can differ by 1, 2, 3 tenths of a millimeter in a range of sizes combined together to have the required height.

Alternatively, a set of more specifically dimensioned and standard spacer elements can be used which can be shortened by milling, squeezing with a percussion mechanism, and such like in order to change their heights to what is required. The use of a standard size spacer elements avoids the need to stock different size spacer elements.

In the present disclosure, the spacer elements 22 take the form of a tube which can slide over the screws before the screws are inserted into the sleeves. Of course, the spacer elements can take other forms and do not have to slide over the screws to provide the function to limit the movement by the fixing elements so that the cooling contact area is in close proximity to the to-be-cooled surface. For example, the spacer elements could fit into recesses or fit over spigots formed as part of the circuit board 3.

Whilst the sleeves 21 have been described as separate parts, these too can be formed as part of the circuit board. In addition, it will be appreciated that the sleeves 21 could take the form of a coupling integrally formed as part of a housing.

Due to the use of the spacer elements, movement of the cooling device is precisely limited to produce an accurate and correct spacing between the cooling surface 17D and to-be-cooled surface 7 of the high-power component 4, for example a few tenths of a millimeter. This enables a closer and more precise proximity to be obtained between the high-power component and the respective part of the cooling surface. This means that the thickness of any TIM layer can be reduced compared with other approaches, thereby enabling optimal cooling of the high-power component.

In addition, the described method ensures that the cooling device and circuit board can be firmly attached and provide this aforementioned advantage without the risk of damage to any components on the circuit board.

Furthermore, the present disclosure enables the fitting of a single cooling device to the circuit board to provide cooling areas which can thermally connect to the to-be-cooled surfaces of several localised components requiring cooling. In this respect, it is advantageous for the high-power component to be located substantially central of the cooling surface of the cooling device in plan view. In particular, the disclosure enables the cooling to be concentrated on a central high-power component.

It will be understood that the embodiments illustrated in the drawings and described above show an application only for the purposes of illustration. In practice, embodiments may be applied to many different configurations, the detailed embodiments being straightforward for those skilled in the art to implement.

For example, it will be appreciated that the fixing elements could comprise spring means which move and or urge the cooling device and circuit board together.

It will be appreciated that, during the assembly of the device, a movement takes place simply by locating the screws 20 in the holes 10 and tightening them once the spacer element 22 has been provided between the circuit board 3 and the cooling device 2. In practice, the spacer elements are chosen and applied after the actual height-position of the high-power component on the PCB has been measured and in this way the spacer element 22 enables precision of the smallest possible distance between the cooling surface and the high-power component of the final set-up.

Example Implementations

Example 1: A method of fitting a cooling device to a circuit board for cooling a high-power electronic component mounted on the circuit board, the method comprising the steps of: providing a cooling device with a cooling surface having a cooling area for thermally connecting to a to be cooled surface of the electronic component; providing fixing elements for moving the cooling surface towards the circuit board; determining a distance position of the to be cooled surface from the circuit board; and selecting, on the basis of the determined distance position, spacer elements to be interposed between the cooling device and the circuit board to limit the movement by the fixing elements to a position where the cooling area is in close proximity to the to be cooled surface.

Example 2: A method according to example 1 wherein the spacer elements are selected to limit the movement by the fixing elements to a position where the cooling area is substantially in contact with the to be cooled surface with a minimal air gap.

Example 3: A method according to example 1 or 2 for cooling one or more additional electronic components mounted on the circuit board, wherein the cooling surface has a respective additional cooling area corresponding to a respective to be cooled surface of the one or more additional electronic components; wherein the or each additional cooling area is spaced from the circuit board by a distance which is greater than said determined distance position.

Example 4: A method according to any preceding example wherein the fixing elements provide a biasing force for moving the cooling surface towards the circuit board.

Example 5: A method according to any preceding example wherein the fixing elements extend between the cooling device and the circuit board for moving the cooling surface towards the circuit board.

Example 6: A method according to any preceding example wherein couplings are provided for the fixing elements to enable the cooling device to be fitted to the circuit board.

Example 7: A method according to any preceding example wherein couplings comprise a part of a housing.

Example 8: A cooling arrangement to cool a high-power electronic component mounted on a circuit board, the cooling arrangement comprising: a cooling device with a cooling surface having a cooling area for thermally connecting to a to be cooled surface of the electronic component, wherein the to be cooled surface is a determined distance position from the circuit board; fixing elements for moving the cooling device towards the circuit board; and spacer elements, selectable on the basis of the determined distance position, for interposing between the cooling device and the circuit board to limit the movement by the fixing elements to a position where the cooling area is in close proximity to the to be cooled surface. Thus, the cooling arrangement can comprise: a cooling device with a cooling surface having a cooling area for thermally connecting to a to be cooled surface of the electronic component, wherein the to be cooled surface is a determined distance position from the circuit board; fixing elements for moving the cooling device towards the circuit board; and spacer elements, selectable on the basis of the determined distance position, for interposing between the cooling device and the circuit board to limit the movement by the fixing elements to a position where the cooling area is in close proximity to the to be cooled surface.

Example 9: A cooling arrangement according to example 8 wherein the spacer elements are selected to limit the movement by the fixing elements to a position where the cooling area is substantially in contact with the to be cooled surface with a minimal air gap.

Example 10: A cooling arrangement to example 8 or 9 to cool one or more additional electronic components mounted on the circuit board, wherein the cooling surface has a respective additional cooling area corresponding to a respective to be cooled surface of the one or more additional electronic components; wherein the or each additional cooling area is spaced from the circuit board by a distance which is greater than said determined distance position.

Example 11: A cooling arrangement according to any one of examples 8 to 10 wherein the fixing elements include means to provide a biasing force for moving the cooling surface towards the circuit board.

Example 12: A cooling arrangement according to any one of examples 8 to 11 wherein the fixing elements are sized to extend in use between the cooling device and the circuit board for moving the cooling surface towards the circuit board.

Example 13: A cooling arrangement according to any one of examples 8 to 12 further comprising couplings provided for the fixing elements to enable the cooling device to be fitted to the circuit board.

Example 14: A cooling arrangement according to any one of examples 8 to 13 wherein a plurality of spacer elements having different lengths are provided for selection.

Example 15: A cooling arrangement according to any one of examples 8 to 14 to cool a single high-power electronic component having a to be cooled surface which is located centrally of the cooling surface.

What is claimed is:

1. A method comprising: providing a cooling device with a one-piece, solid body including, a first cooling surface having a first cooling area for thermally connecting to a first to-be-cooled surface of a first electronic component through a minimal air gap or directly through a first thermal interface material, a second cooling surface having a second cooling area for thermally connecting to a second to-be-cooled surface of a second electronic component directly through a second thermal interface material, a third cooling surface having a third cooling area for thermally connecting to a third to-be-cooled surface of a third electronic component directly through a third thermal interface material, wherein the first cooling surface is between the second cooling surface and the third cooling surface, and the first electronic component is configured to operate at a higher power than each of the second electronic component and the third electronic component, and wherein the first cooling surface protrudes outward from the cooling device beyond the second to-be-cooled surface and the third to-be-cooled surface; providing one or more fixing elements for moving the first cooling surface, the second cooling surface, and the third cooling surface towards a circuit board including the first electronic component, the second electronic component, and the third electronic component; determining a distance position of the first to-be-cooled surface from the circuit board; and selecting, based on the determined distance position, one or more spacer elements to be interposed between the cooling device and the circuit board to limit a movement by the one or more fixing elements to a position where the first cooling area is in vicinity of the first to-be-cooled surface with the minimal air gap therebetween.

2. The method according to claim 1, further comprising:
providing, by the one or more fixing elements, a biasing force for moving the first cooling surface towards the circuit board.

3. The method according to claim 2, wherein the one or more fixing elements extend between the cooling device and the circuit board for moving the first cooling surface towards the circuit board.

4. The method according to claim 1, further comprising:
providing one or more couplings for the one or more fixing elements to enable the cooling device to be fitted to the circuit board.

5. The method according to claim 1, further comprising:
interposing the one or more spacer elements between the cooling device and the circuit board; and
moving, using the one or more fixing elements, the first cooling surface towards the circuit board.

6. The method according to claim 5, further comprising:
limiting, using the one or more spacer elements, the moving of the first cooling surface towards the circuit board; and
positioning, based on the moving and the limiting, the first cooling area of the first cooling surface in proximity to the first to-be-cooled surface of the first electronic component.

7. The method according to claim 6, further comprising:
fitting, using one or more couplings, the cooling device to the circuit board such that the first cooling area of the first cooling surface is in proximity to the first to-be-cooled surface of the electronic component.

8. An apparatus comprising: a cooling device with a one-piece, solid body including; a first cooling surface having a first cooling area configured to thermally connect to a first to-be-cooled surface of a first electronic component through a minimal air gap or directly through a first thermal interface material, the first to-be-cooled surface is a determined distance position from a circuit board, a second cooling surface having a second cooling area for thermally connecting to a second to-be-cooled surface of a second electronic component directly through a second thermal interface material, a third cooling surface having a third cooling area for thermally connecting to a third to-be-cooled surface of a third electronic component directly through a third thermal interface material, wherein the first cooling surface is between the second cooling surface and the third cooling surface, and the first electronic component is configured to operate at a higher power than each of the second electronic component and the third electronic component, and wherein the first cooling surface protrudes outward from the cooling device beyond the second to-be-cooled surface and the third to-be-cooled surface; one or more fixing elements configured to move the first cooling surface, the second cooling surface, and the third cooling surface towards the circuit board including the first electronic component, the second electronic component, and the third electronic component; and one or more spacer elements, which are selected based on the determined distance position, configured to interpose between the cooling device and the circuit board to limit a movement by the one or more fixing elements to a position where the first cooling area is in vicinity of the first to-be-cooled surface with minimal air gap therebetween.

9. The apparatus according to claim 8, wherein the one or more fixing elements are configured to provide a biasing force to move the first cooling surface towards the circuit board.

10. The apparatus according to claim 8, wherein the one or more fixing elements are sized to extend in use between the cooling device and the circuit board to move the first cooling surface towards the circuit board.

11. The apparatus according to claim 8, further comprising:
one or more couplings for the one or more fixing elements configured to enable the cooling device to be fitted to the circuit board.

12. The apparatus according to claim 8, further comprising: the circuit board; and
the first electronic component mounted on the circuit board, the first electronic component further comprising a high-power electronic component having the first to-be-cooled surface, and the first to-be-cooled surface located centrally of the first cooling surface of the cooling device.

* * * * *